US010205089B2

United States Patent
Kim et al.

(10) Patent No.: US 10,205,089 B2
(45) Date of Patent: Feb. 12, 2019

(54) ELECTRONIC DEVICE AND METHOD FOR FABRICATING THE SAME

(71) Applicant: SK hynix Inc., Icheon-Si (KR)

(72) Inventors: Jae-Hong Kim, Icheon-Si (KR);
Min-Suk Lee, Icheon-Si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/295,229

(22) Filed: Jun. 3, 2014

(65) Prior Publication Data

US 2015/0249206 A1    Sep. 3, 2015

(30) Foreign Application Priority Data

Feb. 28, 2014    (KR) .................. 10-2014-0024029

(51) Int. Cl.
| | | |
|---|---|---|
| *H01L 43/08* | (2006.01) | |
| *H01L 43/02* | (2006.01) | |
| *H01L 43/10* | (2006.01) | |
| *H01L 43/12* | (2006.01) | |

(52) U.S. Cl.
CPC .............. *H01L 43/08* (2013.01); *H01L 43/02* (2013.01); *H01L 43/12* (2013.01)

(58) Field of Classification Search
CPC ..... H01L 45/1233; H01L 43/08; H01L 45/04; H01L 27/0688; H01L 27/224
See application file for complete search history.

(56) References Cited

U.S. PATENT DOCUMENTS

| | | |
|---|---|---|
| 6,114,719 A | 9/2000 | Dill et al. |
| 7,046,489 B2 | 5/2006 | Kamiguchi et al. |
| 8,084,835 B2 | 12/2011 | Ranjan et al. |
| 9,130,155 B2 | 9/2015 | Chepulskyy et al. |
| 2002/0146895 A1 | 10/2002 | Ramdani et al. |

(Continued)

FOREIGN PATENT DOCUMENTS

| | | |
|---|---|---|
| KR | 1020030000137 A | 1/2003 |
| KR | 1020030054175 A | 7/2003 |

(Continued)

OTHER PUBLICATIONS

USPTO Final Office Action issued for U.S. Appl. No. 14/158,702, dated Dec. 23, 2015 (10 pages).

(Continued)

*Primary Examiner* — David Spalla
(74) *Attorney, Agent, or Firm* — Perkins Coie LLP

(57) ABSTRACT

This technology provides an electronic device and a method of fabricating the same. An electronic device in accordance with an implementation of this document includes semiconductor memory, and the semiconductor memory includes an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material.

16 Claims, 12 Drawing Sheets

(56) References Cited

U.S. PATENT DOCUMENTS

| | | | |
|---|---|---|---|
| 2004/0063223 A1* | 4/2004 | Costrini | H01L 43/12 |
| | | | 438/3 |
| 2006/0098354 A1 | 5/2006 | Parkin | |
| 2006/0261425 A1* | 11/2006 | Suemitsu | H01L 43/12 |
| | | | 257/421 |
| 2007/0076471 A1* | 4/2007 | Kano | G11C 11/15 |
| | | | 365/158 |
| 2007/0187785 A1 | 8/2007 | Hung et al. | |
| 2007/0297220 A1 | 12/2007 | Yoshikawa et al. | |
| 2010/0055501 A1 | 3/2010 | Nishimura et al. | |
| 2010/0074092 A1 | 3/2010 | Zhu et al. | |
| 2010/0080048 A1 | 4/2010 | Liu et al. | |
| 2011/0089507 A1 | 4/2011 | Mao | |
| 2011/0198756 A1 | 8/2011 | Thenappan et al. | |
| 2011/0228223 A1 | 9/2011 | Jiao et al. | |
| 2011/0248235 A1 | 10/2011 | Jeong et al. | |
| 2011/0297646 A1 | 12/2011 | deVillers et al. | |
| 2012/0092923 A1 | 4/2012 | Bedeschi et al. | |
| 2012/0267733 A1 | 10/2012 | Hu et al. | |
| 2012/0326252 A1* | 12/2012 | Yamakawa | H01L 43/08 |
| | | | 257/421 |
| 2013/0005151 A1 | 1/2013 | Chen et al. | |
| 2013/0043530 A1 | 2/2013 | Kim et al. | |
| 2013/0052826 A1 | 2/2013 | Nepomnishy et al. | |
| 2013/0119494 A1* | 5/2013 | Li | H01L 43/08 |
| | | | 257/421 |
| 2013/0134534 A1 | 5/2013 | Sbiaa et al. | |
| 2013/0161768 A1* | 6/2013 | Khvalkovskiy | G11C 11/161 |
| | | | 257/421 |
| 2013/0248798 A1 | 9/2013 | Yi et al. | |
| 2013/0258763 A1* | 10/2013 | Ranjan | G11C 11/5607 |
| | | | 365/158 |
| 2014/0099735 A1 | 4/2014 | Horng et al. | |
| 2014/0242418 A1 | 8/2014 | Shukh | |
| 2014/0247648 A1 | 9/2014 | Yoon | |
| 2014/0327095 A1 | 11/2014 | Kim et al. | |
| 2014/0365688 A1 | 12/2014 | Lee et al. | |
| 2015/0092480 A1 | 4/2015 | Choi et al. | |
| 2015/0162526 A1 | 6/2015 | Lee et al. | |
| 2015/0357557 A1 | 12/2015 | Kim et al. | |
| 2016/0157715 A1 | 6/2016 | De Boer et al. | |
| 2016/0180905 A1 | 6/2016 | Kim et al. | |
| 2016/0181514 A1 | 6/2016 | Kim et al. | |
| 2016/0308121 A1 | 10/2016 | Kim | |
| 2017/0062712 A1 | 3/2017 | Choi et al. | |
| 2017/0069837 A1 | 3/2017 | Choi et al. | |

FOREIGN PATENT DOCUMENTS

| | | |
|---|---|---|
| KR | 1020040005472 A | 1/2004 |
| KR | 1020060000878 A | 1/2006 |
| KR | 100641500 B1 | 10/2006 |
| KR | 1020060118311 A | 11/2006 |
| KR | 1020070036704 A | 4/2007 |
| KR | 1020070054551 A | 5/2007 |
| KR | 1020090038809 A | 4/2009 |
| KR | 1020100005449 A | 1/2010 |
| KR | 1020100030054 A | 3/2010 |
| KR | 1020100128219 A | 12/2010 |
| KR | 101073132 B1 | 6/2011 |
| KR | 101055595 B1 | 8/2011 |
| KR | 20120047356 A | 5/2012 |
| KR | 20120058113 A | 6/2012 |
| KR | 1020120078631 A | 7/2012 |
| KR | 101171387 B1 | 8/2012 |
| KR | 101209328 B1 | 12/2012 |
| KR | 20130069097 A | 6/2013 |
| KR | 1020140011138 A | 1/2014 |
| KR | 1020140025165 A | 3/2014 |

OTHER PUBLICATIONS

USPTO Non-Final Office Action issued for U.S. Appl. No. 14/158,702, dated Jul. 17, 2015 (16 pages).

USPTO Notice of Allowance and Fees Due for U.S. Appl. No. 14/229,745, dated Oct. 3, 2014 (12 pages).

USPTO Non-Final Office Action issued for U.S. Appl. No. 14/621,646, dated Sep. 15, 2016 (10 pages).

Motice of Allowance for U.S. Appl. No. 14/918,356, dated Aug. 8, 2017 (14 pages).

Non-Final Office Action issued for U.S. Appl. No. 14/846,812, dated May 3, 2017 (50 pages).

USPTO Notice of Allowance for U.S. Appl. No. 14/846,812, dated Sep. 21, 2017 (20 pages).

USPTO Non-Final Office Action for U.S. Appl. No. 14/788,420, dated Sep. 12, 2017 (42 pages).

* cited by examiner

ELECTRONIC DEVICE AND METHOD FOR FABRICATING THE SAME

CROSS-REFERENCE TO RELATED APPLICATION

This patent document claims priority of Korean Patent Application No. 10-2014-0024029, entitled "ELECTRONIC DEVICE AND METHOD FOR FABRICATING THE SAME" and filed on Feb. 28, 2014, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), or an E-fuse, etc.

SUMMARY

The disclosed technology in this patent document includes memory circuits or devices and their applications in electronic devices or systems and various implementations of an electronic device, in which an electronic device facilitates fabricating processes and can improve characteristics of a variable resistance element and a method of fabricating the same.

In one aspect, an electronic device is provided to include a semiconductor memory that includes an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material.

In some implementations, the semiconductor memory further includes a spacer formed over a sidewall of the second part and including the oxide of the first metal. In some implementations, the second part covers only a part of a top surface of the first part. In some implementations, the second part overlaps with the first part, and a width of a top surface of the first part is equal to or larger than a width of a bottom surface of the second part. In some implementations, the second part includes a MTJ (Magnetic Tunnel Junction) structure having a lower magnetic layer, an upper magnetic layer and a tunnel barrier layer interposed between the lower magnetic layer and the upper magnetic layer, and the first metal has a higher electron affinity than a metal included in the lower magnetic layer or the upper magnetic layer. In some implementations, the first metal includes at least one of Al, Hf, Ti or Mg. In some implementations, if the first part includes multiple layers, an uppermost layer of the multiple layers includes the first metal. In some implementations, the first part includes a first lower layer formed along a sidewall and a bottom surface of a remaining space of the contact hole where the lower contact is formed and a second lower layer disposed over the first lower layer and surrounded by the first lower layer except for a top surface of the second lower layer, and the first lower layer includes the first metal. In some implementations, the second part includes a MTJ (Magnetic Tunnel Junction) structure having a lower magnetic layer, an upper magnetic layer and a tunnel barrier layer interposed between the lower magnetic layer and the upper magnetic layer, and the first metal has a higher electron affinity than a metal which is a main component of the lower magnetic layer or the upper magnetic layer. In some implementations, the first metal includes at least one of Al, Hf, Ti or Mg, and the second lower layer includes Ta. In some implementations, the second part covers the second lower layer and exposes at least a part of the first part. In some implementations, the second part overlaps with the first part, a width of a bottom surface of the second part is equal to or smaller than a width of a top surface of the first part, and a width of a bottom surface of the second part is equal to or larger than a width of a top surface of the second lower layer. In some implementations, the second part includes a MTJ (Magnetic Tunnel Junction) structure having a lower magnetic layer, an upper magnetic layer and a tunnel barrier layer interposed between the lower magnetic layer and the upper magnetic layer, and a lower layer interposed between the MTJ structure and the first part.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device is provided to include a semiconductor memory that includes an interlayer dielectric layer formed over a substrate and having a contact hole; a lower contact filled in the contact hole; and a variable resistance element which is disposed over the interlayer dielectric layer and is coupled to the lower contact, wherein the lower contact includes a first metal which has a higher electron affinity than a component included in the variable resistance element, and an oxide of the first metal has an insulating property.

In some implementations, the semiconductor memory further includes a spacer formed over a sidewall of the variable resistance element and including the oxide of the first metal. In some implementations, the variable resistance element covers only a part of a top surface of the lower contact. In some implementations, the variable resistance element overlaps with the lower contact, and a width of a top surface of the lower contact is equal to or larger than a width of a bottom surface of the variable resistance element. In some implementations, the variable resistance element includes a MTJ (Magnetic Tunnel Junction) structure having a lower magnetic layer, an upper magnetic layer and a tunnel barrier layer interposed between the lower magnetic layer and the upper magnetic layer, and the first metal has a higher electron affinity than a metal which is a main component of the lower magnetic layer or the upper magnetic layer. In some implementations, the first metal includes at least one of Al, Hf, Ti or Mg. In some implementations, the lower contact includes a first lower contact formed along a sidewall and a bottom surface of the contact hole and a second lower contact disposed over the first lower contact, and surfaces except for a top surface of the second lower contact is surrounded by the first lower contact, and the first lower contact includes the first metal. In some implementations, the lower contact includes a first lower contact formed along a profile of the contact hole and a second lower contact disposed over the first lower contact and having a bottom and sides surrounded by the first lower contact, and the first lower contact includes the first metal. In some implementations, the second lower contact has a higher gap filling property or a higher electrical conductivity as compared with the first lower contact. In some implementations, the variable resistance element covers the second lower contact and exposes at least a part of the first lower contact. In some implementations, the variable resistance element overlaps with the lower contact, a width of a bottom surface of the variable resistance element is equal to or smaller than a width of a top surface of the lower contact, and a width of a bottom surface of the variable resistance element is equal to or larger than a width of a top surface of the second lower contact.

In another aspect, a method of manufacturing an electronic device comprising semiconductor memory is provided to include: forming an interlayer dielectric layer having a contact hole over a substrate; forming a lower contact filled in a part of the contact hole; forming a first part filled in a remaining space of the contact hole where the lower contact is formed; and forming a second part which is disposed over the interlayer dielectric layer and is coupled to the first part, wherein the first part and the second part form a variable resistance element in combination, wherein the first part includes a first metal which has a higher electron affinity than a component included in the second part, and an oxide of the first metal is an insulating material. In another aspect, a method of manufacturing an electronic device comprising semiconductor memory is provided to include: forming an interlayer dielectric layer having a contact hole over a substrate; forming a lower contact filled in a part of the contact hole; forming a first part of a variable resistance element to be filled in another part of the contact hole where the lower contact is formed; and forming a second part of the variable resistance element over the interlayer dielectric layer to be coupled to the first part, wherein the first part and the second part form a variable resistance element in combination, wherein the first part includes a first metal which has a higher electron affinity than a component included in the second part, and an oxide of the first metal is an insulating material. In another aspect, a method of manufacturing an electronic device comprising semiconductor memory, the method comprising: forming an interlayer dielectric layer having a contact hole over a substrate; forming a lower contact filled in the contact hole; and forming a variable resistance element which is disposed over the interlayer dielectric layer and is coupled to the lower contact, wherein the lower contact includes a first metal which has a higher electron affinity than a component included in the variable resistance element, and an oxide of the first metal is an insulating material.

In some implementations, the method further includes: causing the first metal to be re-deposited over a sidewall of the second part, and oxidizing the re-deposited first metal after the forming of the second part.

These and other aspects, implementations and associated advantages are described in greater detail in the drawings, the description and the claims.

DETAILED DESCRIPTION

Figure 1A:
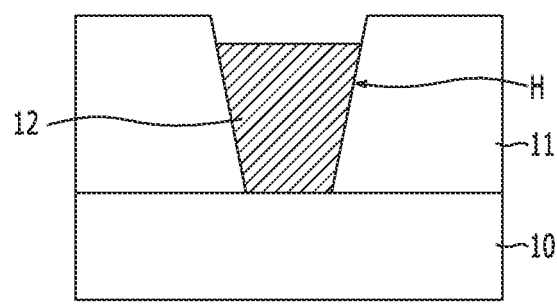
FIGS. 1A to 1D are cross-sectional views explaining a semiconductor device and an example of a method for fabricating the same in accordance with an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
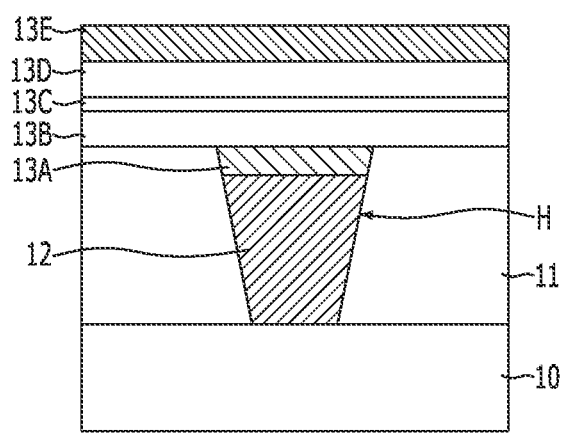
Figure 1C:
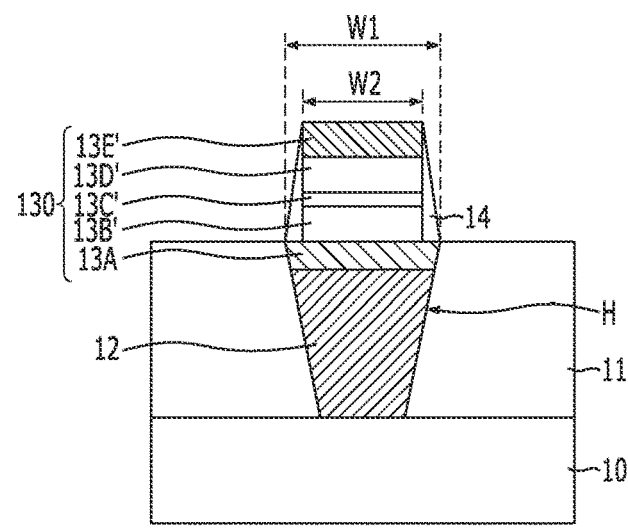
Figure 1D:
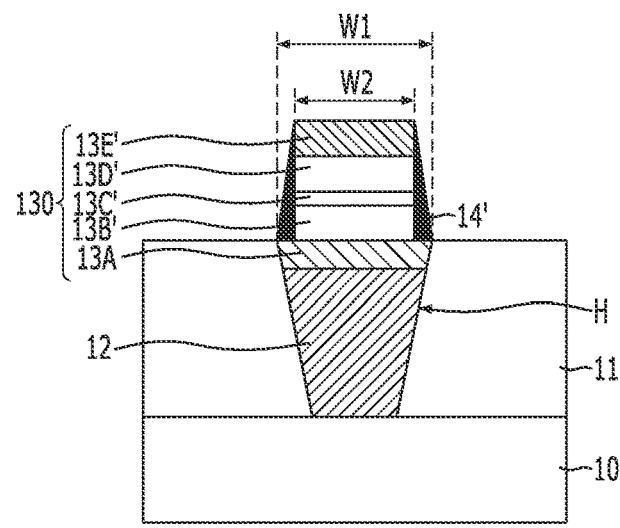

FIGS. 1A to 1D are cross-sectional views explaining a semiconductor device and an example of a method for fabricating the same in accordance with an implementation. FIG. 1D shows an example of the semiconductor device, and FIGS. 1A to 1C show intermediate processing steps for forming the semiconductor device of FIG. 1D.

First, the fabricating method will be described.

Referring to FIG. 1A, a substrate 10 including a specific structure, for example, a switching element (not shown) may be provided. The switching element, which is coupled to a variable resistance element, controls the supply of a current or voltage to the variable resistance element. The switching element may be a transistor, a diode, etc. One end of the switching element may be electrically coupled to a lower contact which will be described later, and the other end of the switching element may be electrically coupled to a line, for example, a source line.

An interlayer dielectric layer 11 may be formed over the substrate 10. The interlayer dielectric layer 11 may be or include various insulating materials, such as a silicon oxide, etc.

A contact hole H exposing a part of the substrate 10 may be formed by selectively etching the interlayer dielectric layer 11, and then a lower contact 12 filling a part of the contact hole H may be formed. The lower contact 12 may be formed by depositing a conductive material having a thickness to sufficiently fill the contact hole H, and then performing an etch-back process to the conductive material until an upper surface of the lower contact 12 becomes lower than that of the interlayer dielectric layer 11. The lower contact 12 may be formed of a conductive material which has an excellent gap filling property and a high electrical conductivity, such as W, Ta, TiN, etc.

Referring to FIG. 1B, a multi-layer structure including layers 13A, 13B, 13C, 13D and 13E may be formed over a resultant structure of FIG. 1A. The multi-layer structure may be configured to form a variable resistance element.

In this implementation, the variable resistance element includes a Magnetic Tunnel Junction (MTJ) structure including two magnetic layers and a tunnel barrier layer interposed therebetween, and additional layers disposed under and/or over the MTJ structure having various uses, for example, improving a characteristic of the variable resistance element and/or facilitating processes. As is well known, it is difficult to satisfy a desired characteristic of the variable resistance element when using only the MTJ structure. Therefore, it is necessary to dispose one or more additional layers under and/or over the MTJ structure in certain implementations. For the convenience of description, one or more layers disposed under the MTJ structure will be referred to as a lower layer, and one or more layers disposed over the MTJ structure will be referred to as an upper layer. Each of the lower layer and the upper layer may be a single layer or a multiple layer. The lower layer and/or the upper layer may be a part of the variable resistance element, so the lower layer and/or the upper layer may be differentiated from the lower contact 12 and upper contact (not shown) which are coupled to the variable resistance element for electrically connecting the variable resistance element with another element (now shown). For forming the variable resistance element, the multi-layer structure may include a lower magnetic layer 13B, an upper magnetic layer 13D, a tunnel barrier layer 13C interposed between the lower magnetic layer 13B and the upper magnetic layer 13D, a lower layer 13A disposed under the lower magnetic layer 13B, and an upper layer 13E disposed over the upper magnetic layer 13E.

In this implementation, the lower layer 13A may be filled in the contact hole H where the lower contact 12 is formed. The lower layer 13A may be formed by depositing a material layer for forming the lower layer 13A over the resultant structure of FIG. 1A, and then performing a planarization process, for example, a CMP (Chemical Mechanical Polishing) process until the interlayer dielectric layer 11 is exposed. Subsequently, the lower magnetic layer 13B, the tunnel barrier layer 13C, the upper magnetic layer 13D and the upper layer 13E may be sequentially deposited over the lower layer 13A and the interlayer dielectric layer 11.

The lower magnetic layer 13B and the upper magnetic layer 13D may include a ferromagnetic material. The ferromagnetic material may be an alloy of which a main component is Fe, Ni and/or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc. One of the lower magnetic layer 13B and the upper magnetic layer 13D may be a pinned layer having a pinned magnetization direction, and the other thereof may be a free layer having a variable magnetization direction.

The tunnel barrier layer 13C may change the magnetization direction of the free layer by the tunneling of electrons. The tunnel barrier layer 13C may include an oxide such as MgO, CaO, SrO, TiO, VO, NbO, etc.

The lower layer 13A may include a metal-containing layer. The metal-containing layer may include a metal which has a higher electron affinity than a component included in the lower magnetic layer 13B and the upper magnetic layer 13D. The lower magnetic layer 13B and the upper magnetic layer 13D may include Fe, Ni and/or Co, and has an insulating property when the metal is oxidized. The metal may include one or more Al, Ti, Hf, Mg, etc. The metal-containing layer may be a metal layer or a metal compound layer such as a metal oxide layer, a metal nitride layer, a metal borides layer, etc.

The below Table 1 shows a standard electrode potential of various metals. An increase of a negative value (−) means an increase of ease of oxidation. Referring to Table 1, a difference of a standard electrode potential is great between a metal included in the lower layer 13A and a metal included in the lower magnetic layer 13B and the upper magnetic layer 13D.

TABLE 1

| Metal | standard electrode potential E° |
|---|---|
| Al | −1.66 |
| Ti | −1.63 |
| Hf | −1.55 |
| Mg | −2.37 |
| Fe | −0.45 |
| Co | −0.28 |
| Ni | −0.228 |
| Ta | −0.60 |
| W | 0.10 |

The lower layer 13A may be formed as a single layer or multiple layers. The lower layer 13A formed as a single layer may include the above metal-containing layer. The lower layer 13A formed as multiple layers may include the above metal-containing layer for its uppermost layer only. In this case, one or more remaining layers except for the uppermost layer may be used in improving a characteristic of the MTJ structure. The remaining layer(s) of the lower layer 13A may perform various functions as needed. For example, the remaining layer(s) of the lower layer 13A may include a layer which increases adhesion to the lower contact 12 and/or a layer which has a magnetization direction opposite to the pinned layer of the MTJ structure and offset an influence of a magnetic field applied to the free layer by the pinned layer.

The upper layer 13E may include a single layer or a multiple layer which has various functions as needed. For example, the upper layer 13E may include a conductive layer which has a strong resistance to a physical etching and function as a hard mask in subsequent steps of etching the upper magnetic layer 13D, the tunnel barrier layer 13C and the lower magnetic layer 13B. The upper layer 13E may include a tungsten layer. For example, the upper layer 13E may include a layer which has a magnetization direction opposite to the pinned layer of the MTJ structure and offset an influence of a magnetic field applied to the free layer by the pinned layer.

Referring to FIG. 1C, an upper pattern 13E', an upper magnetic pattern 13D', a tunnel barrier pattern 13C' and a lower magnetic pattern 13B' may be formed by etching the upper layer 13E, the upper magnetic layer 13D, the tunnel barrier layer 13C and the lower magnetic layer 13B using a mask (not shown) for patterning the variable resistance element. As a result, a variable resistance element 130 is formed to include the lower layer 13A, the lower magnetic pattern 13B', the tunnel barrier pattern 13C', the upper magnetic pattern 13D' and the upper pattern 13E'. Since the lower layer 13A has a shape defined by the contact hole H in the aforementioned process of FIG. 1B, this etching process may be applied for the upper layer 13E, the upper magnetic layer 13D, the tunnel barrier layer 13C and the lower magnetic layer 13B. This etching process may be performed by using a strong physical etching characteristic, for example, IBE (Ion Beam Etching) method.

As a result, the variable resistance element may be formed such that a part of the variable resistance element 130 is filled in the interlayer dielectric layer 11 and a remaining part of the variable resistance element 130 protrudes from the interlayer dielectric layer 11. Here, the part of the variable resistance element 130 that is filled in the interlayer dielectric layer 11 may include the lower layer 13A, and the remaining part of the variable resistance element 130 that protrudes from the interlayer dielectric layer 11 may include a stacked structure of the lower magnetic pattern 13B', the tunnel barrier pattern 13C', the upper magnetic pattern 13D' and the upper pattern 13E'. The remaining part of the variable resistance element 130 may overlap with the contact hole H. In this case, a width W2 of a bottom surface of the remaining part of the variable resistance element 130 is equal to or smaller than a width W1 of a top end of the contact hole H. That is, the remaining part of the variable resistance element 130 may be disposed over the lower layer 13A which has a planarized surface. Since the tunnel barrier pattern 13C' is over a planar surface, it is possible to avoid a degradation of characteristics of the MTJ structure. If the remaining part of the variable resistance element 130 has a width larger than the contact hole H, the tunnel barrier pattern 13C' may be bent over a boundary between the lower layer 13A and the interlayer dielectric layer 11, thereby degrading characteristics of the MTJ structure.

When the remaining part of the variable resistance element 130 is formed over the lower layer 13A, a part of the lower layer 13A may be exposed during etching the upper layer 13E, the upper magnetic layer 13D, the tunnel barrier layer 13C and the lower magnetic layer 13B. Thus, a conductive material included in the lower layer 13A may be re-deposited over a sidewall of the remaining part of the variable resistance element 130. The re-deposited conductive material is represented by a reference numeral 14. As described above, since the lower layer 13A includes a metal which has a high electron affinity and an insulating property when it is oxidized, the re-deposited conductive material 14 may include the metal as well. The re-deposited conductive material 14 may allow a current to flow between the lower magnetic pattern 13B' and the upper magnetic pattern 13D' which should be insulated from each other for a normal operation of the MTJ structure. Referring to FIG. 1D, a process is explained, which may be used to prevent the re-deposited conductive material 14 from interfering with the normal operation of the MTJ structure.

In FIG. 1D, a resultant structure of FIG. 1C may be subject to an oxidation process. The oxidation process may be performed by using a plasma oxidation or by flowing an oxygen-containing gas. Here, a metal included in the re-deposited conductive material 14 may have a high electron affinity compared with a metal included in the lower magnetic pattern 13B' and the upper magnetic pattern 13D'. That is, there is a large difference in a standard electrode potential. Therefore, it is possible to perform a selective oxidation which oxidizes the re-deposited conductive material 14 only and suppresses an oxidation of the lower magnetic pattern 13B' and the upper magnetic pattern 13D'. The re-deposited conductive material that has oxidized is represented by a reference numeral 14', and referred to as an insulating spacer. Since the insulating spacer 14' includes a metal oxide which has an insulating property, for example, an oxide of Al, Ti, Hf, Mg, etc., an electrical connection between the lower magnetic pattern 13B' and the upper magnetic pattern 13C' may be prevented. Furthermore, the insulating spacer 14' may be formed over a sidewall of the remaining part of the variable resistance element 130 and protect the variable resistance element 130. For example, the insulating spacer 14' prevents the variable resistance element 130 from reacting to other materials in subsequent processes. In this case, a process of forming an additional spacer for protecting the variable resistance element 130 may be skipped, and thus, a fabricating can be simplified.

Next, required subsequent processes are performed. In one implementation, although not shown, an upper contact may be formed over the variable resistance element 130 to be electrically coupled to the variable resistance element 130. Further, a bit line may be formed over the upper contact to be electrically coupled to the upper contact.

Referring again to FIG. 1D, the semiconductor device is formed to include the interlayer dielectric layer 11 which is disposed over the substrate 10 and has the contact hole H, the lower contact 12 filled in a part of the contact hole H, the variable resistance element 130 which fills a part of the contact hole H over the lower contact 12 and protrudes from the interlayer dielectric layer 11, and the insulating spacer 14' disposed over a sidewall of the variable resistance element 130.

The variable resistance element 130 may include the lower layer 13A, the lower magnetic pattern 13B', the tunnel barrier pattern 13C', the upper magnetic pattern 13D' and the upper pattern 13E'. The variable resistance element 130 may be operated to store data as will be described below. When a current is supplied through the lower contact 12 and the upper contact (not shown), magnetization directions of the lower magnetic pattern 13B' and the upper magnetic pattern 13D' become parallel or anti-parallel to each other. For example, When the magnetization directions are parallel to each other, the variable resistance element 130 may exhibit a low resistant state and store data "0", and, when the magnetization directions are anti-parallel to each other, the variable resistance element 130 may exhibit a high resistant state and store data "1".

In this implementation, the lower layer 13A may be filled in a part of the contact hole H, and the stacked structure of the lower magnetic pattern 13B', the tunnel barrier pattern 13C', the upper magnetic pattern 13D' and the upper pattern 13E' may overlap with the lower layer 13A over the lower layer 13A and protrude over the interlayer dielectric layer 11. The width W1 of a top surface of the lower layer 13A is equal to or a larger than the width W2 of a bottom surface of the stacked structure of the lower magnetic pattern 13B', the tunnel barrier pattern 13C', the upper magnetic pattern 13D' and the upper pattern 13E'.

The lower layer 13A may include a metal which has a higher electron affinity than a component included in the lower magnetic layer 13B and the upper magnetic layer 13D. Such a metal with a high electron affinity may include a main component such as Fe, Ni and/or Co, and has an insulating property when the metal is oxidized. It is possible to form the insulating spacer 14' which has a insulating property and includes an oxide of a metal included in the lower layer 13A, over a sidewall of the stacked structure of the lower magnetic pattern 13B', the tunnel barrier pattern 13C', the upper magnetic pattern 13D' and the upper pattern 13E'.

The above implementations may be used to achieve one or more following advantages.

First, because the lower layer 13A as a part of the variable resistance element 130 is filled in the contact hole H together with the lower contact 12, etching is not required to form the lower layer 13A. Therefore, an etching thickness may be reduced when patterning the other layers of variable resistance element 130 above the lower layer 13A, thereby facilitating or simplifying an etching process.

Also, the width of the top surface of the lower layer 13A can be designed to be equal to or larger than the width of the bottom surface of the remaining part of the variable resistance element 130. This configuration can advantageously increase an alignment margin between the lower layer 13A and the remaining part of the variable resistance element 130 and to improve the level of the flatness of the tunnel barrier pattern 13C'.

Furthermore, by controlling the above widths, although the part of the lower layer 13A is exposed during the patterning of the variable resistance element 130, and the conductive material included in the lower layer 13A is re-deposited over the sidewall of the remaining part of the variable resistance element 130, the conductive material may be changed into the insulating spacer 14' using a simple oxidation process. Thus, the variable resistance element 130 may be protected, and a defect may be prevented.

Figure 2A:
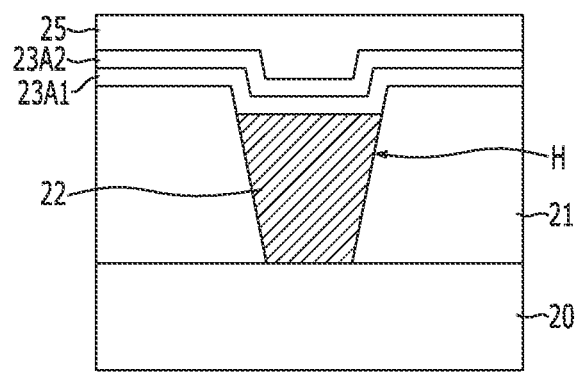
FIGS. 2A to 2E are cross-sectional views explaining a semiconductor device and an example of a method for fabricating the same in accordance with another implementation of the disclosed technology.
Figure 2B:
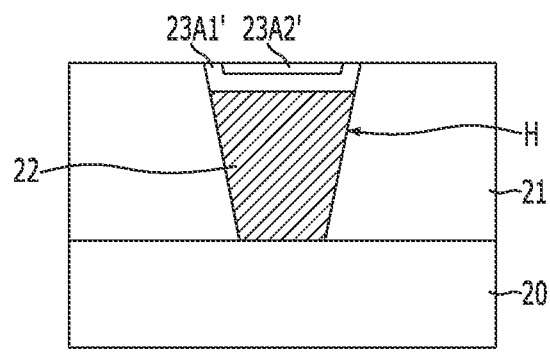
Figure 2C:
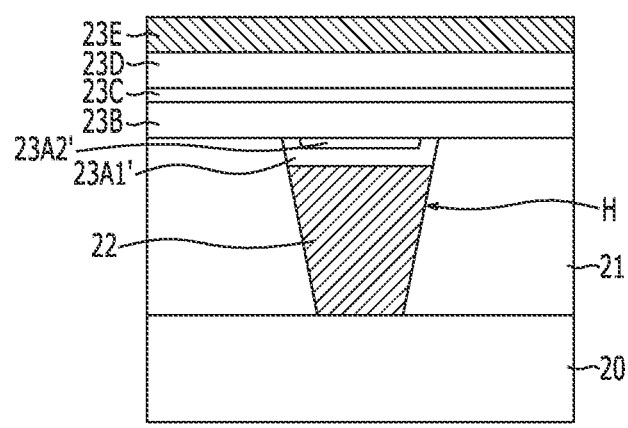
Figure 2D:
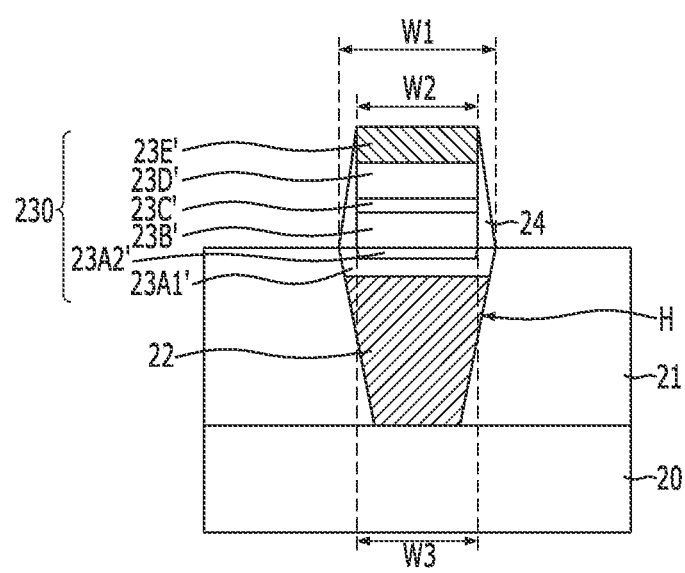
Figure 2E:
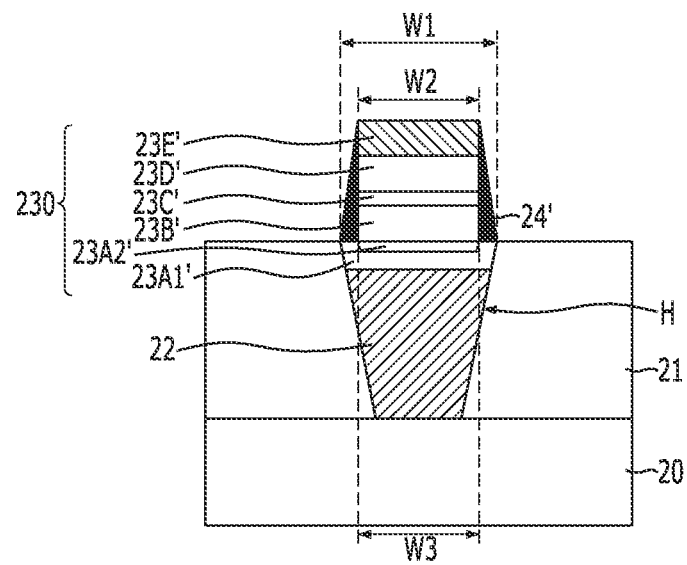

FIGS. 2A to 2E are cross-sectional views explaining a semiconductor device and an example of a method for fabricating the same in accordance with another implementation. FIG. 2E shows an example of the semiconductor device, and FIGS. 2A to 2D show intermediate processing steps for forming the semiconductor device of FIG. 2E. A difference from the aforementioned implementation will be mainly described below.

Referring to FIG. 2A, an interlayer dielectric layer 21 having a contact hole H may be formed over a substrate 20, and then, a lower contact 22 may be formed to fill a part of the contact hole H.

A first lower layer 23A1 and a second lower layer 23A2 may be formed over the resultant structure having the lower contact 22 and along a profile of the resultant structure. The first lower layer 23A1 may include a metal having a higher electron affinity than a component included in a magnetic layer which will be described layer. Further, the metal has an insulating property when it is oxidized. For example, the magnetic layer may include Fe, Ni and/or Co, and the metal may include one or more Al, Ti, Hf, Mg, etc. The second lower layer 23A2 may include a different material from the first lower layer 23A1 and function to improve a characteristic of a MTJ structure. Furthermore, the second lower layer 23A2 may be in direct contact with the MTJ structure as needed. For example, the second lower layer 23A2 may include a material which contacts with both ends of the MTJ structure and functions as an electrode including, such as Ta. When Ta is used for an electrode, it is possible to prevent an abnormal increase in a resistance of the MTJ structure, for example, an increase of a value of HRD (High resistance depth). Thus, it is advantageous to improve a characteristic of the MTJ structure. While it is explained in this implementation that the second lower layer 23A2 is used as an electrode including Ta, other implementations are also possible. For example, the second lower layer 23A2 may include other materials which are in direct contact with the MTJ structure to improve the characteristic of the MTJ structure.

A sacrificial layer 25 may be formed over the second lower layer 23A2. When the first lower layer 23A1 and the second lower layer 23A2 are polished in a subsequent process, since the first lower layer 23A1 and the second lower layer 23A2 include different materials from each other, they are likely to be dent or corroded due to a difference in polishing characteristics between different materials. The sacrificial layer 25 operates to prevent this damage from occurring. For example, the sacrificial layer 25 may include a silicon nitride.

Referring to FIG. 2B, a first lower pattern 23A1' and a second lower pattern 23A2' are formed to fill a remaining space of the contact hole H. In one implementation, the lower contact 21 may be formed by polishing the first lower layer 23A1 and the second lower layer 23A2 until the interlayer dielectric layer 21 is exposed.

The first lower pattern 23A1' may be formed along a sidewall and a surface of the remaining space of the contact hole H. The second lower pattern 23A2' may be disposed over the first lower pattern 23A1' and surrounded by the first lower pattern 23A1' except for a top surface of the second lower pattern 23A2'.

Referring to FIG. 2C, the lower magnetic layer 23B, the tunnel barrier layer 23C, the upper magnetic layer 23D and the upper layer 23E may be sequentially deposited over the first lower pattern 23A1', the second lower pattern 23A2' and the interlayer dielectric layer 21.

Referring to FIG. 2D, an upper pattern 23E', an upper magnetic pattern 23D', a tunnel barrier pattern 23C' and a lower magnetic pattern 23B' may be formed by etching the upper layer 23E, the upper magnetic layer 23D, the tunnel barrier layer 23C and the lower magnetic layer 3B using a mask (not shown) for patterning the variable resistance element. As a result, a variable resistance element 230 is formed to include a part filled in the contact hole H and another part protruding from the interlayer dielectric layer 21. In FIG. 2D, the first and second lower patterns 23A1', 23A2' are filled in the contact hole H, and a stacked structure including the lower magnetic pattern 23B', the tunnel barrier pattern 23C', the upper magnetic pattern 23D' and the upper pattern 23E' protrudes over the interlayer dielectric layer 21.

The stacked structure of the variable resistance element 230 may overlap with the contact hole H. The width W2 of the bottom surface of the stacked structure is equal to or smaller than the width W1 of the top surface of the contact hole H. Furthermore, the width W2 of the bottom surface of the stacked structure is equal to or larger than the width W3 of the top surface of the second lower pattern 23A2'. That is, the stacked structure of the variable resistance element 230 may cover the second lower pattern 23A2' and expose at least a part of the first lower pattern 23A1'. Thus, a conductive material included in the first lower pattern 23A1' may be re-deposited over a sidewall of the stacked structure of the variable resistance element 230. The re-deposited conductive material is represented by a reference numeral 24. Since the second lower pattern 23A2' is not exposed, a conductive material included in the second lower pattern 23A2' may not be re-deposited.

Referring to FIG. 2E, the re-deposited conductive material 24 may be changed into an insulating spacer 24' by performing an oxidation process to the resultant structure of FIG. 2D.

By the aforementioned processes, the semiconductor device of FIG. 2E may be fabricated. In FIG. 2E, the MTJ structure includes lower layers including the first lower pattern 23A1' and the second lower pattern 23A2'. The second lower pattern 23A2' has a top surface contacting with the MTJ structure, and the first lower pattern 23A1' surrounds the surfaces of the second lower pattern 23A2' except for its top surface.

In the semiconductor device of FIG. 1D, since the lower layer 13A (or at least the uppermost layer of the lower layer 13A) includes a specific metal which has a high electron affinity and of which oxidation has an insulating property, a bottom end of the MTJ structure contacts with the layer containing the metal only and does not contact with other layers including various materials. Differently from the semiconductor device of FIG. 1D, in the semiconductor device of FIG. 2D the bottom end of the MTJ structure can contact with various layers to improve the characteristic of the MTJ structure. For example, a Ta layer which can be used as an electrode may contact with the bottom end of the MTJ structure. Further, the semiconductor device of FIG. 1D accomplishes all the advantages as provided from the semiconductor device of FIG. 1D.

Meanwhile, in the aforementioned implementations of FIGS. 1A to 2E, the whole part of the lower layer of the variable resistance element is filled in the contact hole. However, in another implementation, only a part of the lower layer of the variable resistance element may be filled in the contact hole and the remaining part of the lower layer of the variable resistance element may protrude over the interlayer dielectric layer. This implementation will be described exemplarily referring to FIGS. 3A and 3B.

Figure 3A:
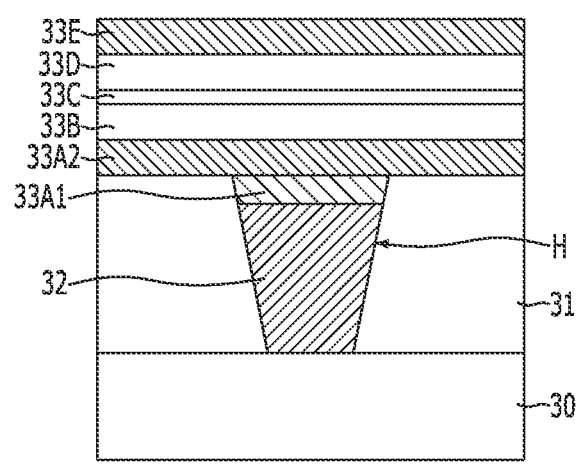
FIGS. 3A and 3B are cross-sectional views explaining a semiconductor device and an example of a method for fabricating the same in accordance with another implementation of the disclosed technology.
Figure 3B:
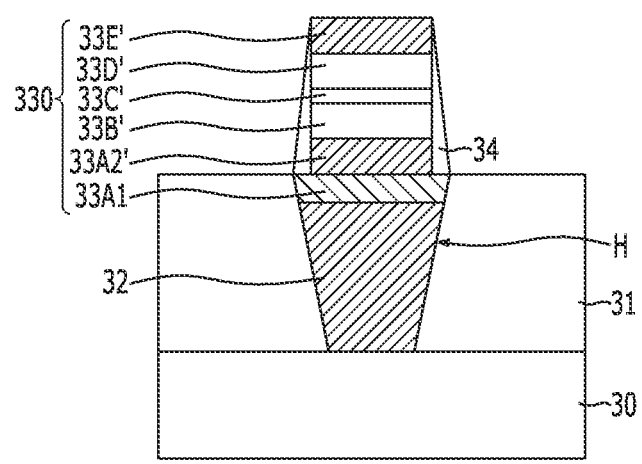

FIGS. 3A and 3B are cross-sectional views explaining a semiconductor device and an example of a method for fabricating the same in accordance with another implementation. A difference from the aforementioned implementations will be mainly described below.

Referring to FIG. 3A, an interlayer dielectric layer 31 having a contact hole H may be formed over a substrate 30. Then, a lower contact 32 may be formed to fill a part of the contact hole H.

A first lower layer 33A1 may be formed to fill a remaining space of the contact hole H where the lower contact 32 is formed. The first lower layer 33A1 may be substantially same as the lower layer 13A of FIGS. 1A to 1D. Alternatively, the first lower layer 33A1 may be substantially same as the first and second lower patterns 23A1' and 23A2' of FIGS. 2A to 2E.

The second lower layer 33A2, the lower magnetic layer 33B, the tunnel barrier layer 33C, the upper magnetic layer 33D and the upper layer 33E may be sequentially deposited over the first lower layer 33A1 and the interlayer dielectric layer 31. The second lower layer 33A2 may include various materials to improve the characteristic of the MTJ structure, and be formed as a single layer or multiple layers.

Referring to FIG. 3B, a variable resistance element 330 may be formed by etching the second lower layer 33A2, the lower magnetic layer 33B, the tunnel barrier layer 33C, the upper magnetic layer 33D and the upper layer 33E using a mask (now shown) for patterning the variable resistance element 330. The variable resistance element may include a part filled in the contact hole H and another part protruding from the interlayer dielectric layer 31. The first lower layer 33A1 is filled in the contact hole H, while a stacked structure including a second lower pattern 33A2', a lower magnetic pattern 33B', a tunnel barrier pattern 33C', an upper magnetic pattern 33D' and an upper pattern 33E' protrudes over the interlayer dielectric layer 31.

A conductive material included in the first lower layer 33A1 may be re-deposited over a sidewall of the stacked structure of the variable resistance element 330. The re-deposited conductive material is represented by a reference numeral 34.

Then, although not shown, the re-deposited conductive material may be changed into an insulating spacer by an oxidation process.

By the aforementioned processes, the semiconductor device of FIG. 3B may be fabricated. The semiconductor device of FIG. 3B includes the lower layer disposed under the MTJ structure and including a part protruding over the interlayer dielectric layer 31. In this implementation, although an etching thickness during the patterning of the variable resistance element is slightly increased, all the advantages of the aforementioned implementations can be still accomplished.

Meanwhile, in FIGS. 1A to 3B, a part of the variable resistance element is filled in the contact hole. However, in another implementation, a whole variable resistance element may be disposed over an interlayer dielectric layer, while only a lower contact may be filled in the contact hole. In this case, if the width of the bottom surface of the variable resistance element is smaller than that of the top surface of the lower contact, it is required to control a material included in the lower contact. This implementation will be described exemplarily referring to FIGS. 4A and 5B.

Figure 4A:
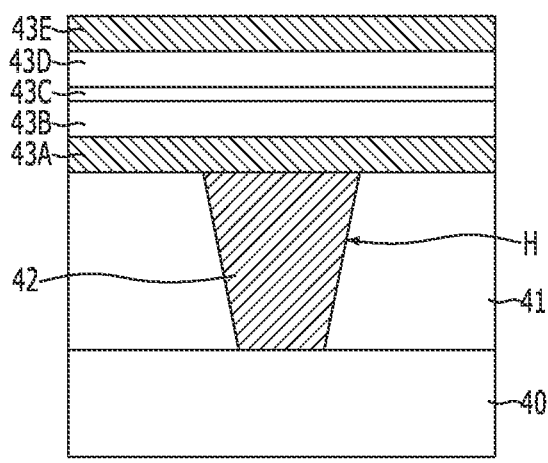
FIGS. 4A and 4B are cross-sectional views explaining a semiconductor device and an example of a method for fabricating the same in accordance with another implementation of the disclosed technology.
Figure 4B:
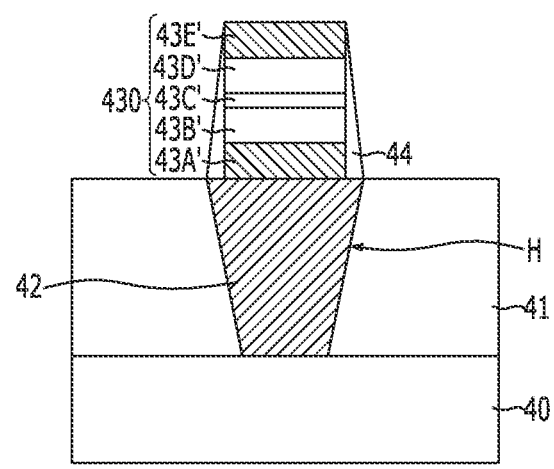

FIGS. 4A and 4B are cross-sectional views explaining a semiconductor device and an example of a method for fabricating the same in accordance with another implementation.

Referring to FIG. 4A, an interlayer dielectric layer 41 having a contact hole H may be formed over a substrate 40. Then, a lower contact 42 may be formed to fill a whole of the contact hole H. The lower contact 42 may be formed by depositing a conductive material having a thickness to sufficiently fill the contact hole H, and then performing a planarization process until the interlayer dielectric layer 41 is exposed.

The lower contact 42 may include a conductive material for electrically connecting a variable resistance element with another element. The conductive material may include a metal which has a higher electron affinity than a component included in a magnetic layer of the variable resistance element and of which oxidization has an insulating property. For example, The magnetic layer may include Fe, Ni and/or Co, and the metal may include one or more Al, Ti, Hf, Mg, etc.

A lower layer 43A, a lower magnetic layer 43B, a tunnel barrier layer 43C, an upper magnetic layer 43D and an upper layer 43E may be sequentially deposited over the lower contact 42 and the interlayer dielectric layer 41. The lower layer 43A may include various materials to improve the characteristic of the MTJ structure, and may be formed as a single layer or multiple layers.

Referring to FIG. 4B, a variable resistance element 430 may be formed by etching the lower layer 43A, the lower magnetic layer 43B, the tunnel barrier layer 43C, the upper magnetic layer 43D and the upper layer 43E using a mask (now shown) for patterning the variable resistance element 430. The variable resistance element 430 may be formed to include a stacked structure including a lower pattern 43A', a lower magnetic pattern 43B', a tunnel barrier pattern 43C', an upper magnetic pattern 43D' and an upper pattern 43E'. The stacked structure protrudes over the interlayer dielectric layer 41

A conductive material included in the lower contact 42 may be re-deposited over a sidewall of the stacked structure of the variable resistance element 430. The re-deposited conductive material is represented by a reference numeral 44.

Then, although not shown, the re-deposited conductive material 44 may be changed into an insulating spacer by an oxidation process.

By the aforementioned processes, the semiconductor device of FIG. 4B may be fabricated. In FIG. 4B, a whole of the variable resistance element 430 protrudes over the interlayer dielectric layer 41. In this implementation, although an etching thickness during the patterning of the variable resistance element is slightly increased, all the advantages of the aforementioned implementations can be still accomplished.

Figure 5A:
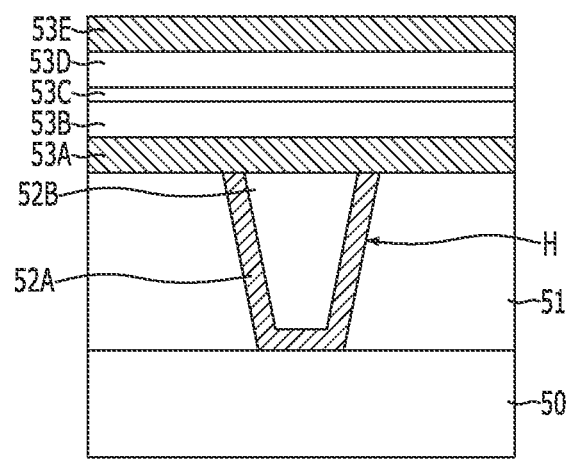
FIGS. 5A and 5B are cross-sectional views explaining a semiconductor device and an example of a method for fabricating the same in accordance with another implementation of the disclosed technology.
Figure 5B:
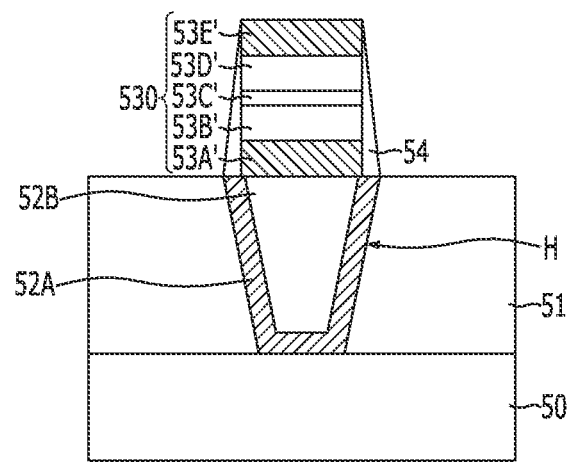

FIGS. 5A and 5B are cross-sectional views explaining a semiconductor device and an example of a method for fabricating the same in accordance with another implementation.

Referring to FIG. 5A, an interlayer dielectric layer 51 having a contact hole H may be formed over a substrate 50. Then, a first lower contact 52A may be formed along a sidewall and a bottom surface of the contact hole H and a second lower contact 52B may be formed to fill a remaining space of the contact hole H where the first lower contact 52A is formed. Surfaces of the second lower contact 52B except for the top surface may be surrounded by the first lower contact 52A.

The first lower contact 52A may include a metal which has a higher electron affinity than a component included in a magnetic layer of a variable resistance element. Further, the metal has an insulating property when it is oxidized. For example, the magnetic layer may include Fe, Ni and/or Co, and the metal may include one or more Al, Ti, Hf, Mg, etc. The second lower contact 52B may include a conductive material different from the material of the first lower contact 52A. The conductive material included in the second lower contact 52B may satisfy a characteristic necessary for a contact. For example, the conductive material may have an excellent gap filling property and/or a high electrical conductivity. The second lower contact 52B may include such as W, Ta, TiN, etc.

A lower layer 53A, a lower magnetic layer 53B, a tunnel barrier layer 53C, an upper magnetic layer 53D and an upper layer 53E may be sequentially deposited over the first lower contact 52A, the second lower contact 52B and the interlayer dielectric layer 51. The lower layer 53A may include various materials to improve the characteristic of the MTJ structure, and may be formed as a single layer or multiple layers.

Referring to FIG. 5B, a variable resistance element 530 may be formed by etching the lower layer 53A, the lower magnetic layer 53B, the tunnel barrier layer 53C, the upper magnetic layer 53D and the upper layer 53E using a mask (now shown) for patterning the variable resistance element 530. The variable resistance element 530 may include a stacked structure which includes a lower pattern 53A', a lower magnetic pattern 53B', a tunnel barrier pattern 53C', an upper magnetic pattern 53D' and an upper pattern 53E'. The stacked structure protrudes over the interlayer dielectric layer 51. The variable resistance element 530 may overlap with the contact hole H. The width of the bottom surface of the variable resistance element 530 is equal to or smaller than the width of the top surface of the contact hole H. Furthermore, the width of the bottom surface of the variable resistance element 530 is equal to or larger than the width of the top surface of the second lower contact 52B.

A conductive material included in the first lower contact 52A may be re-deposited over the sidewall of the variable resistance element 530. The re-deposited conductive material is represented by a reference numeral 54.

Then, although not shown, the re-deposited conductive material 54 may be changed into an insulating spacer by an oxidation process.

By the aforementioned processes, the semiconductor device of FIG. 5B may be fabricated. In FIG. 5B, a whole of the variable resistance element 530 protrudes over the interlayer dielectric layer 51. In this implementation, although an etching thickness during the patterning of the variable resistance element is slightly increased, all the advantages of the aforementioned implementations of FIGS. 1A to 3B can be still achieved. Furthermore, an additional material may be used to provide a desired characteristic of a lower contact.

While it is explained in the aforementioned implementations that the variable resistance element includes a MTJ structure, other limitations are also possible.

Various implementations of the present disclosure may be applied to the variable resistance element having a part filled in the interlayer dielectric layer and a remaining part protruding over the interlayer dielectric layer. In this case, the width of the protruding part is smaller than the width of the filled-in part so that a material included in the filled-in part is re-deposited over a sidewall of the protruding part. The filled-in part may include a metal which has a higher electron affinity than a component, for example, a main component, included in the protruding part. Further, the metal has an insulating property when it is oxidized, thereby preventing a defect due to a re-deposited material.

Alternately, various implementations of the present disclosure may be applied to the variable resistance element which is coupled to a lower contact filled in an interlayer dielectric layer and protrudes over the interlayer dielectric layer. In this case, the width of the variable resistance element is smaller than the width of the lower contact so that a material included in the lower contact is re-deposited over a sidewall of the variable resistance element. The lower contact may include a metal which has a higher electron affinity than a component, for example, a main component, included in the variable resistance element. Further, the metal has an insulating property when it is oxidized, thereby preventing a defect due to a re-deposited material.

The above and other memory circuits or semiconductor devices based on the disclosed technology can be used in a range of devices or systems. FIGS. 6-10 provide some examples of devices or systems that can implement the memory circuits disclosed herein.

Figure 6:
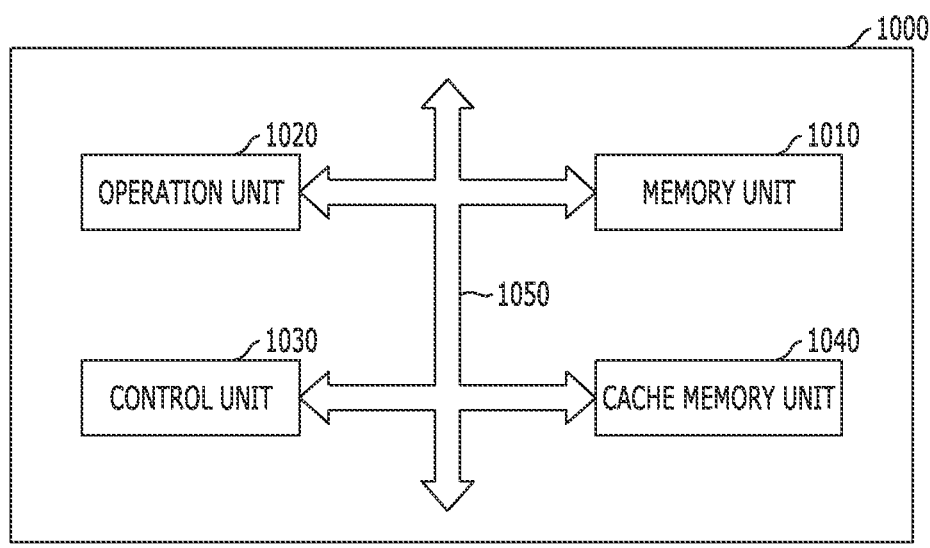
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the memory unit 1010 may become simplified and data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
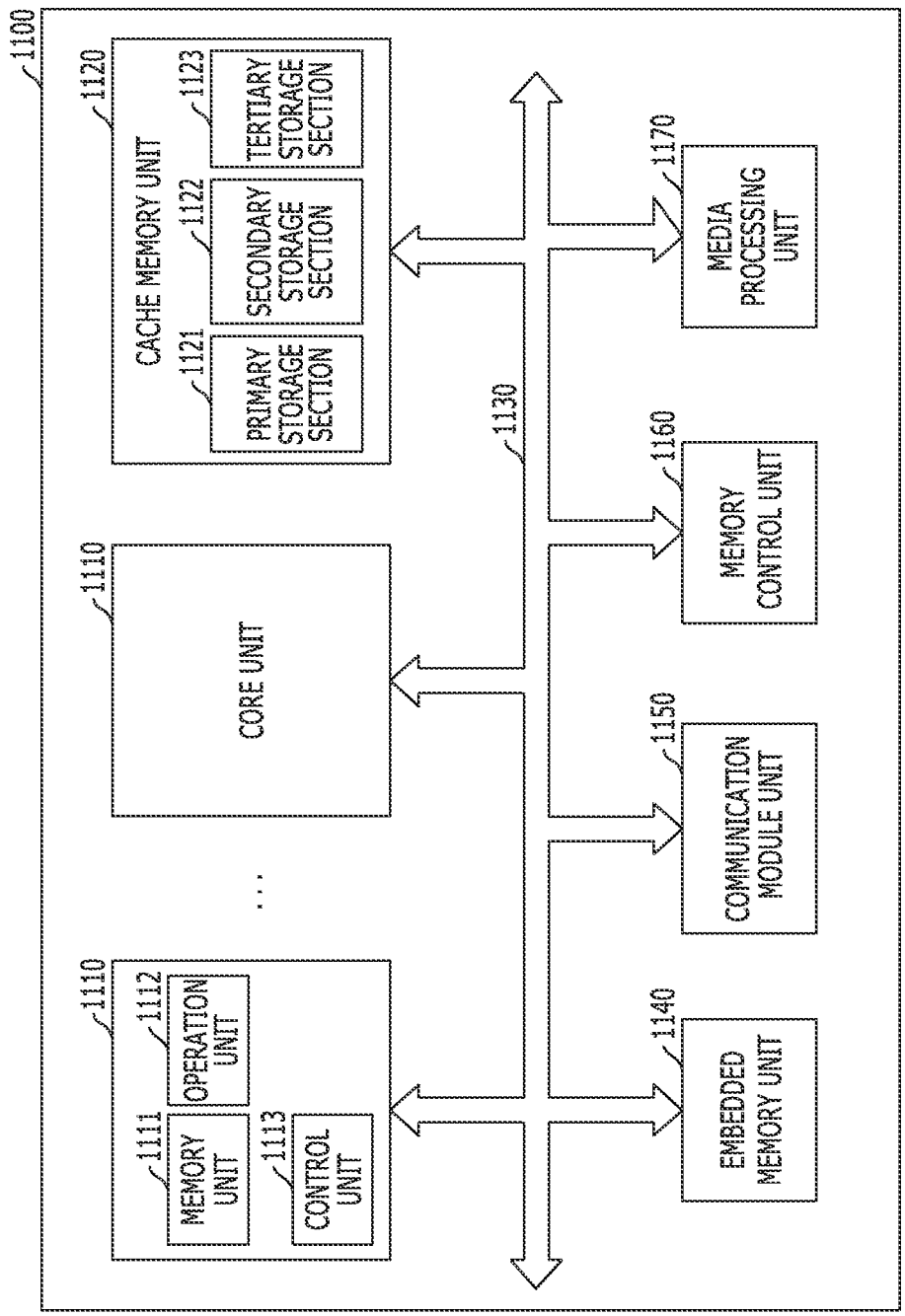
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the cache memory unit 1120 may become simplified and data storage characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
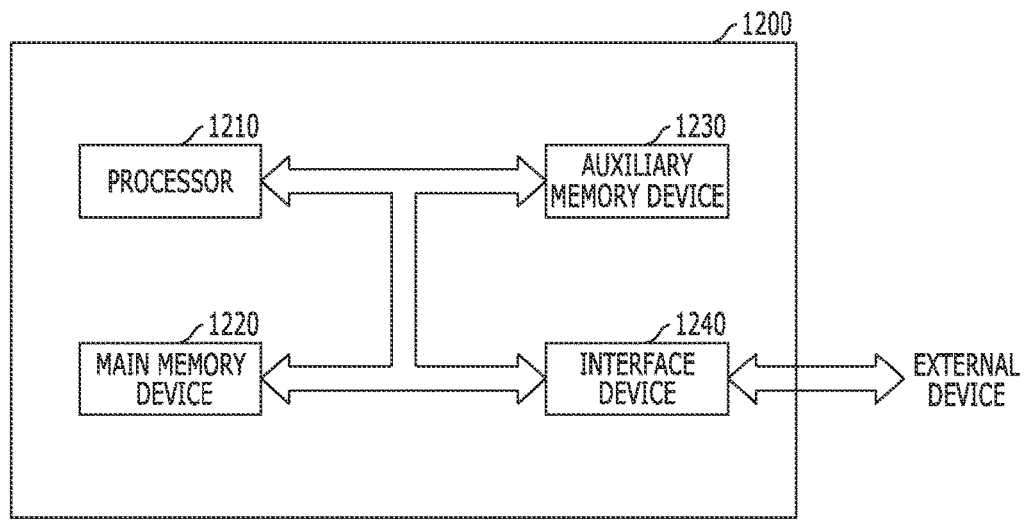
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the main memory device 1220 may become more simplified and data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the auxiliary memory device 1230 may become simplified and data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
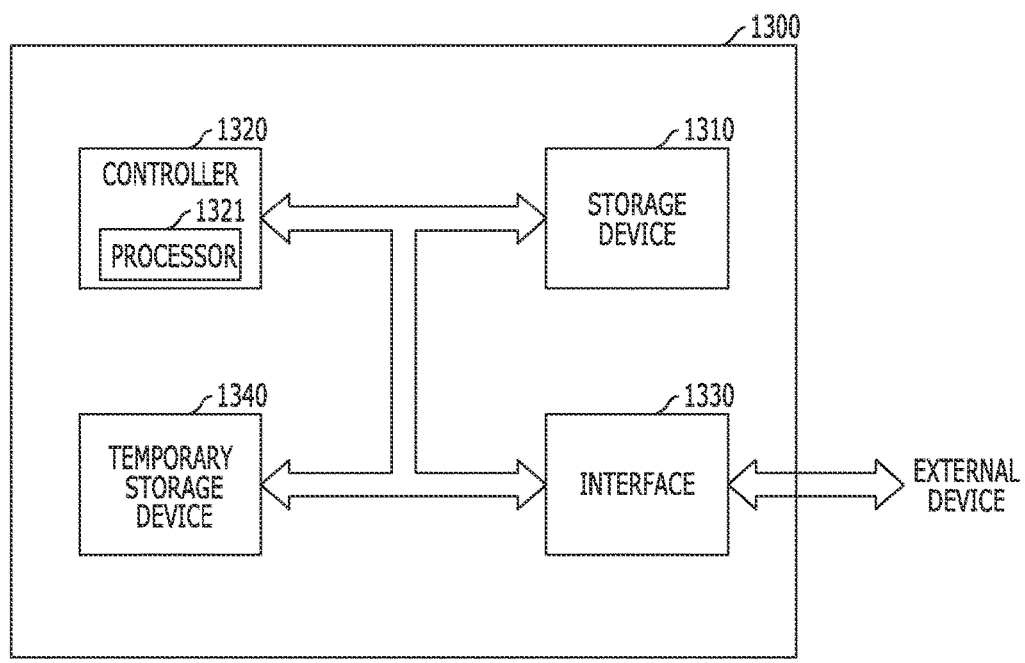
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the storage device 1310 or the temporary storage device 1340 may become more simplified and data storage characteristics of the storage device 1310 or the temporary storage device 1340 may be improved. As a consequence, operating characteristics and data storage characteristics of the data storage system 1300 may be improved.

Figure 10:
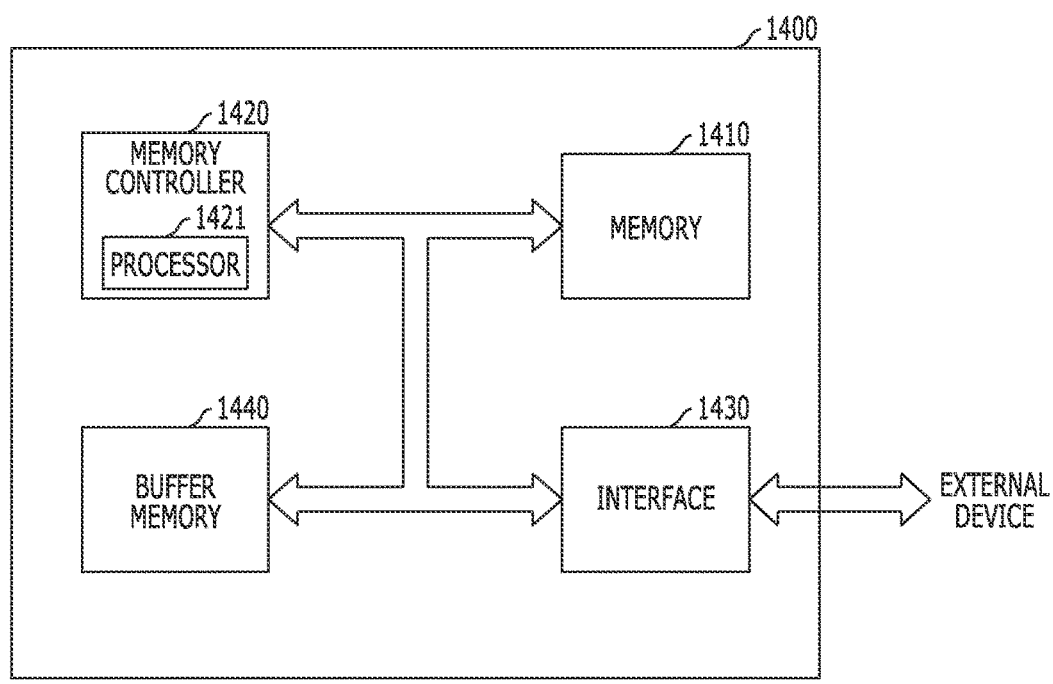
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the memory 1410 may become simplified and data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an interlayer dielectric layer formed over a substrate and having a contact hole; a lower contact filled in a part of the contact hole; and a variable resistance element which is disposed over and coupled to the lower contact, and has a first part filled in the contact hole and a second part disposed over the first part and protruding over the interlayer dielectric layer, wherein the first part includes a first metal which has a higher electron affinity than a component included in the second part, and an oxide of the first metal is an insulating material. Through this, a fabrication process of the buffer memory 1440 may become more simplified and data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising semiconductor memory, wherein the semiconductor memory includes:
   an interlayer dielectric layer formed over a substrate and having a contact hole;
   a lower contact filled in a part of the contact hole; and
   a variable resistance element which is disposed over and coupled to the lower contact, and has a first part filled in the contact hole and a second part disposed over the first part and protruding over the interlayer dielectric layer, the second part having sidewalls orthogonal to a top surface of the interlayer dielectric layer, and
   wherein the first part exhibits a non-magnetic characteristic and includes a first metal which has a higher electron affinity than a component included in the second part,
   wherein the second part overlaps with the first part, and a width of a top surface of the first part is larger than a width of a bottom surface of the second part so that a portion of the top surface of the first part is exposed by the second part,
   wherein the semiconductor memory further includes an insulating spacer that is formed on the exposed portion of the top surface of the first part and directly contacts the first part and the second part, the insulating spacer including an oxide of the first metal of the first part.

2. The electronic device of claim 1, wherein the second part includes a MTJ (Magnetic Tunnel Junction) structure having a lower magnetic layer, an upper magnetic layer and a tunnel barrier layer interposed between the lower magnetic layer and the upper magnetic layer, and
   the first metal has a higher electron affinity than a metal included in the lower magnetic layer or the upper magnetic layer.

3. The electronic device of claim 1, wherein if the first part includes multiple layers, an uppermost layer of the multiple layers includes the first metal.

4. The electronic device of claim 1, wherein the first part includes a first lower layer formed along a sidewall and a bottom surface of a remaining space of the contact hole where the lower contact is formed, and a second lower layer disposed over the first lower layer and surrounded by the first lower layer except for a top surface of the second lower layer, and
   the first lower layer includes the first metal.

5. The electronic device of claim 4, wherein the second part includes a MTJ (Magnetic Tunnel Junction) structure having a lower magnetic layer, an upper magnetic layer and a tunnel barrier layer interposed between the lower magnetic layer and the upper magnetic layer, and
   the first metal has a higher electron affinity than a metal which is a main component of the lower magnetic layer or the upper magnetic layer.

6. The electronic device of claim 4, wherein the second part covers the second lower layer and exposes at least a part of the first part.

7. The electronic device of claim 4, wherein the second part overlaps with the first part, a width of a bottom surface of the second part is equal to or smaller than a width of a top surface of the first part, and a width of a bottom surface of the second part is equal to or larger than a width of a top surface of the second lower layer.

8. The electronic device of claim 1, wherein the second part includes a MTJ (Magnetic Tunnel Junction) structure having a lower magnetic layer, an upper magnetic layer and a tunnel barrier layer interposed between the lower magnetic layer and the upper magnetic layer, and a lower layer interposed between the MTJ structure and the first part.

9. An electronic device comprising semiconductor memory, wherein the semiconductor memory includes:
   an interlayer dielectric layer formed over a substrate and having a contact hole;
   a lower contact filled in the contact hole; and
   a variable resistance element which is disposed over the interlayer dielectric layer and is coupled to the lower contact,
   wherein the lower contact exhibits a non-magnetic characteristic and includes a first metal which has a higher electron affinity than a component included in the variable resistance element,
   wherein the variable resistance element overlaps with the lower contact, and a width of a top surface of the lower contact is larger than a width of a bottom surface of the variable resistance element so that a portion of the top surface of the lower contact is exposed by the variable resistance element,
   wherein the semiconductor memory further includes an insulating spacer that is formed on the exposed portion of the top surface of the lower contact and directly contacts the variable resistance element and the lower contact, the insulating spacer including an oxide of the first metal in the lower contact,
   wherein the variable resistance element has sidewalls orthogonal to a top surface of the interlayer dielectric layer.

10. The electronic device of claim 9, wherein the variable resistance element includes a MTJ (Magnetic Tunnel Junction) structure having a lower magnetic layer, an upper magnetic layer and a tunnel barrier layer interposed between the lower magnetic layer and the upper magnetic layer, and
    the first metal has a higher electron affinity than a metal which is a main component of the lower magnetic layer or the upper magnetic layer.

11. The electronic device of claim 9, wherein the lower contact includes a first lower contact formed along a profile of the contact hole and a second lower contact disposed over the first lower contact and having a bottom and sides surrounded by the first lower contact, and
    the first lower contact includes the first metal.

12. The electronic device of claim 11, wherein the second lower contact has a higher gap filling property or a higher electrical conductivity as compared with the first lower contact.

13. The electronic device of claim 11, wherein the variable resistance element covers the second lower contact and exposes at least a part of the first lower contact.

14. The electronic device of claim 11, wherein the variable resistance element overlaps with the lower contact, a width of a bottom surface of the variable resistance element is equal to or smaller than a width of a top surface of the lower contact, and a width of a bottom surface of the variable resistance element is equal to or larger than a width of a top surface of the second lower contact.

15. The electronic device of claim 1, wherein the first metal includes at least one of Hf, Ti or Mg.

16. The electronic device of claim 9, wherein the first metal includes at least one of Hf, Ti or Mg.

* * * * *